(12) United States Patent
Makiyama

(10) Patent No.: US 10,916,645 B2
(45) Date of Patent: Feb. 9, 2021

(54) COMPOUND SEMICONDUCTOR DEVICE INCLUDING PROTECTIVE LAYER AND OHMIC ELECTRODE

(71) Applicant: FUJITSU LIMITED, Kawasaki (JP)

(72) Inventor: Kozo Makiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/206,162

(22) Filed: Nov. 30, 2018

(65) Prior Publication Data
US 2019/0189792 A1 Jun. 20, 2019

(30) Foreign Application Priority Data
Dec. 20, 2017 (JP) ................. 2017-244247

(51) Int. Cl.
| | |
|---|---|
| *H01L 29/778* | (2006.01) |
| *H01L 29/66* | (2006.01) |
| *H01L 29/43* | (2006.01) |
| *H01L 29/40* | (2006.01) |
| *H01L 29/08* | (2006.01) |
| *H01L 21/285* | (2006.01) |
| *H01L 21/02* | (2006.01) |
| *H01L 21/04* | (2006.01) |

(52) U.S. Cl.
CPC ........ *H01L 29/7786* (2013.01); *H01L 21/043* (2013.01); *H01L 21/28587* (2013.01); *H01L 29/66* (2013.01); *H01L 29/66462* (2013.01); *H01L 29/778* (2013.01); *H01L 21/0254* (2013.01); *H01L 21/0262* (2013.01); *H01L 21/02378* (2013.01); *H01L 21/02458* (2013.01); *H01L 21/02576* (2013.01); *H01L 21/0485* (2013.01); *H01L 29/0843* (2013.01); *H01L 29/401* (2013.01); *H01L 29/432* (2013.01)

(58) Field of Classification Search
CPC ......... H01L 21/28587; H01L 21/02378; H01L 21/024558; H01L 21/0254; H01L 21/02567; H01L 21/0262; H01L 29/7786; H01L 29/66462; H01L 29/0843; H01L 29/401; H01L 29/432; H01L 21/02458; H01L 21/043; H01L 21/0485; H01L 29/66; H01L 29/778
See application file for complete search history.

(56) References Cited

U.S. PATENT DOCUMENTS

| | | | | |
|---|---|---|---|---|
| 5,825,048 | A * | 10/1998 | Arai ................. | B82Y 10/00 257/25 |
| 6,078,071 | A * | 6/2000 | Matsuda ........... | H01L 21/28587 257/280 |

(Continued)

FOREIGN PATENT DOCUMENTS

| | | |
|---|---|---|
| JP | 2004-228481 A | 8/2004 |
| JP | 2017-59671 A | 3/2017 |

*Primary Examiner* — Mohsen Ahmadi
(74) *Attorney, Agent, or Firm* — Westerman, Hattori, Daniels & Adrian, LLP

(57) ABSTRACT

A compound semiconductor device includes: a compound semiconductor area including, at an upper most portion, a protective layer made of a compound semiconductor; and an ohmic electrode provided on the compound semiconductor area, the ohmic electrode being away from the protective layer in plan view and being not in contact with the protective layer.

7 Claims, 19 Drawing Sheets

(56) References Cited

U.S. PATENT DOCUMENTS

| | | | |
|---|---|---|---|
| 7,906,417 B2* | 3/2011 | Makiyama | H01L 29/66431 438/570 |
| 9,502,435 B2* | 11/2016 | Afzali-Ardakani | H01L 27/1218 |
| 9,812,562 B1* | 11/2017 | Chang | H01L 29/2003 |
| 2001/0009279 A1* | 7/2001 | Kikkawa | H01L 21/28587 257/24 |
| 2002/0005528 A1* | 1/2002 | Nagahara | H01L 21/28593 257/189 |
| 2002/0163929 A1* | 11/2002 | Li | H04L 12/413 370/448 |
| 2004/0201038 A1 | 10/2004 | Kimura et al. | |
| 2009/0026466 A1* | 1/2009 | Kikkawa | H01L 21/02378 257/77 |
| 2010/0163929 A1* | 7/2010 | Ohki | H01L 29/41758 257/194 |
| 2011/0079822 A1* | 4/2011 | Kanamura | H01L 21/28587 257/192 |
| 2013/0105810 A1* | 5/2013 | Nishimori | H03F 3/245 257/76 |
| 2013/0126897 A1* | 5/2013 | Imada | H01L 29/66431 257/76 |
| 2013/0146889 A1* | 6/2013 | Makiyama | H01L 29/2003 257/76 |
| 2014/0015608 A1* | 1/2014 | Kotani | H01L 29/2003 330/277 |
| 2014/0084334 A1* | 3/2014 | Nakamura | H01L 29/66348 257/139 |
| 2014/0367700 A1* | 12/2014 | Prechtl | H01L 29/778 257/77 |
| 2015/0091173 A1* | 4/2015 | Kamada | H01L 23/53223 257/751 |
| 2015/0295074 A1* | 10/2015 | Ozaki | H01L 29/7787 257/194 |
| 2017/0077283 A1* | 3/2017 | Nakata | H01L 29/0843 |
| 2017/0125545 A1* | 5/2017 | Yamada | H01L 29/207 |
| 2017/0125569 A1* | 5/2017 | Ozaki | H01L 29/7786 |
| 2019/0189746 A1* | 6/2019 | Makiyama | H01L 21/2258 |

* cited by examiner

FIG.8

| COORDINATES (x mm, y mm) | (0, 0) | (0, +25) | (0, −25) | (25, 0) | (−25, 0) |
|---|---|---|---|---|---|
| WITHOUT GaN Cap | 0.125 | 0.070 | 0.152 | 0.092 | 0.077 |
| WITH GaN Cap | 0.088 | 0.272 ✗ | 0.043 | 2.012 ✗ | 0.032 |

COMPOUND SEMICONDUCTOR DEVICE INCLUDING PROTECTIVE LAYER AND OHMIC ELECTRODE

CROSS-REFERENCE TO RELATED APPLICATION

This application is based on and claims priority to Japanese Patent Application No. 2017-244247 filed on Dec. 20, 2017, the entire contents of which are incorporated herein by reference.

FIELD

The embodiments discussed herein relate to a compound semiconductor device and a method for producing the compound semiconductor device.

BACKGROUND

With respect to semiconductor devices using compound semiconductors, there are many reports on field effect transistors, particularly high electron mobility transistors (HEMTs). For example, for a GaN-based HEMT, an AlGaN HEMT using GaN as an electron transit layer and AlGaN as an electron supply layer attracts attention. In an AlGaN HEMT, due to a lattice constant difference between GaN and AlGaN, distortion occurs in AlGaN. Thereby, due to piezo polarization and spontaneous polarization of AlGaN, a high concentration two-dimensional electron gas (2DEG) can be obtained. Therefore, an AlGaN HEMT is expected as a power amplifier for wireless communication, a high-efficiency switching device, and a high withstand voltage power device for an electric vehicle or the like.

RELATED-ART DOCUMENTS

Patent Documents

[Patent Document 1] Japanese Laid-open Patent Publication No. 2004-228481
[Patent Document 2] Japanese Laid-open Patent Publication No. 2017-59671

In a compound semiconductor device, in order to protect the surface of a compound semiconductor area, a cap layer of GaN or the like is formed in the uppermost layer in many cases. However, in such a case, the contact resistance of an ohmic electrode (ohmic contact resistance), such as a source electrode or a drain electrode, with a compound semiconductor area is high.

SUMMARY

According to an aspect of the embodiments, a compound semiconductor device includes: a compound semiconductor area including, at an upper most portion, a protective layer made of a compound semiconductor; and an ohmic electrode provided on the compound semiconductor area, the ohmic electrode being away from the protective layer in plan view and being not in contact with the protective layer.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIG. 8 is a table illustrating ohmic contact resistance for when a selective regrowth process is applied to a compound semiconductor area of an InAlGaN HEMT with respect to the presence/absence of a cap layer;

DESCRIPTION OF EMBODIMENT

First Embodiment

An InAlGaN HEMT (High Electron Mobility Transistor) that is a nitride semiconductor will be described as a compound semiconductor device according to a first embodiment.

FIGS. 1 to 5 are schematic cross-sectional views sequentially illustrating steps of a method for producing an InAlGaN HEMT according to the first embodiment.

Figure 1A:
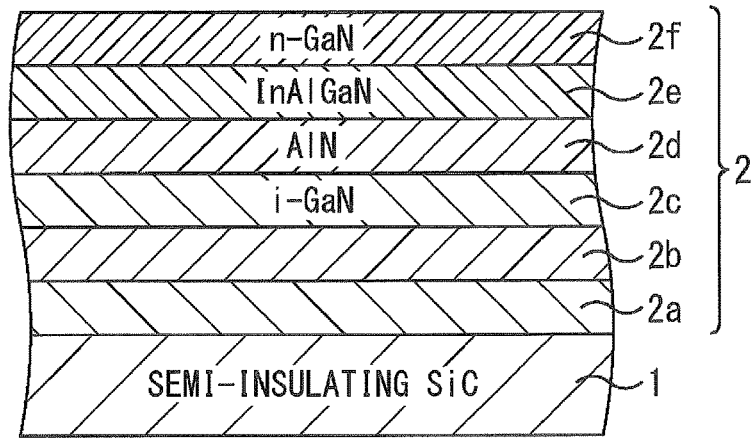
FIGS. 1A to 1C are schematic cross-sectional views sequentially illustrating steps of a method for producing an InAlGaN HEMT according to a first embodiment.

First, as illustrated by FIG. 1A, a compound semiconductor area 2 is formed on a SiC substrate 1 that is an example of a substrate for growth. As the substrate for growth, a Si substrate, a sapphire substrate, a GaN substrate, or the like may be used instead of the SiC substrate. Also, the substrate may have either a semi-insulating property or a conductive property.

The compound semiconductor area 2 is configured to include a nucleation layer 2a, a buffer layer 2b, an electron transit layer 2c, an intermediate layer 2d, an electron supply layer 2e, and a cap layer 2f. The cap layer 2f is formed on the uppermost portion of the compound semiconductor area 2 and is a protective layer that protects the surface of the compound semiconductor area 2.

In an InAlGaN HEMT, a two-dimensional electron gas (2DEG) is generated in the electron transit layer 2c at a position near the interface between the electron transit layer 2c and the electron supply layer 2e (precisely, the intermediate layer 2d). This 2DEG is generated due to a difference in lattice constant between a compound semiconductor (e.g., GaN) of the electron transit layer 2c and a compound semiconductor (e.g., InAlGaN) of the electron supply layer 2e and due to a spontaneous polarization difference.

Over the SiC substrate 1, by a MOVPE (Metal Organic Vapor Phase Epitaxy) method, each compound semiconductor is grown as follows. Instead of the MOVPE method, any other appropriate method such as a MBE (Molecular Beam Epitaxy) method may be used.

Over the SiC substrate 1, AlN with a thickness of approximately 100 nm, GaN with a thickness of approximately 1 µm, i (intentionally undoped)-GaN with a thickness of approximately 0.2 µm, AlN with a thickness of approximately 1 nm, an InAlGaN with a thickness of approximately 10 nm, and n-GaN with a thickness of approximately 3 nm are sequentially grown. Thereby, the nucleation layer 2a, the buffer layer 2b, the electron transit layer 2c, the intermediate layer 2d, the electron supply layer 2e, and the cap layer 2f are formed. The intermediate layer 2d is formed as needed and may not be formed in some cases. As the electron supply layer 2e, instead of InAlGaN, AlGaN having a high Al composition (for example, having an Al composition greater than or equal to 50%) may be grown to form an AlGaN HEMT in some cases. Also, InAlN may be formed as the electron supply layer 2e to form an InAlN HEMT. Also, AlN may be formed as the electron supply layer 2e to form an AlN HEMT. As the cap layer 2f, InGaN may be grown instead of GaN.

For a growth condition of AlN, a mixed gas of a trimethylaluminum (TMA) gas and an ammonia ($NH_3$) gas is used as a material gas. For a growth condition of GaN, a mixed gas of a trimethylgallium (TMG) gas and an $NH_3$ gas is used as a material gas. For a growth condition of AlGaN, a mixed gas of a TMA gas, a TMG gas, and an $NH_3$ gas is used as a material gas. For a growth condition of InAlGaN, a mixed gas of a trimethylindium (TMI) gas, a TMA gas, a TMG gas, and an $NH_3$ gas is used as a material gas.

Depending on a compound semiconductor layer to be grown, the supply and the flow rates of the TMI gas that is an In source, the TMA gas that is an Al source, and the TMG gas that is a Ga source are set as appropriate. The flow rate of the ammonia gas, which is a common material, is set in a range between approximately 100 ccm and approximately 10 LM. Also, the growth pressure is in a range between approximately 50 Torr and approximately 300 Torr, and the growth temperature is in a range between approximately 700° C. and approximately 1100° C.

When GaN of the cap layer 2f grows as an n-type, a $SiH_4$ gas containing, for example, Si as an n-type impurity is added to a material gas at a predetermined flow rate and Si is doped into GaN. The doping concentration of Si is in a range of approximately $5 \times 10^{17}/cm^3$ to approximately $5 \times 10^{18}/cm^3$. In the case of growing, as the cap layer 2f, InGaN instead of GaN and when InGaN of the cap layer 2f grows as an n-type, the doping concentration of Si is also in a range of approximately $5 \times 10^{17}/cm^3$ to approximately $5 \times 10^{18}/cm^3$.

Figure 1B:
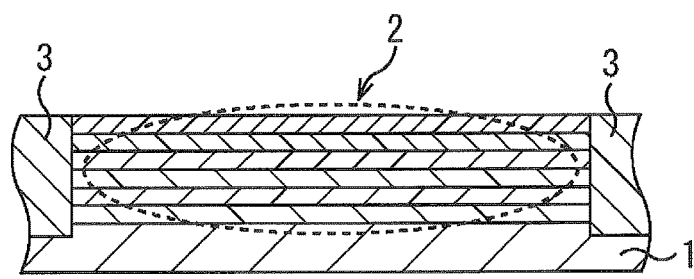

Next, as illustrated in FIG. 1B, element isolation structures 3 are formed.

For example, argon (Ar) is injected into element isolation areas of the compound semiconductor area 2.

As a result, the element isolation structures 3 are formed in the compound semiconductor area 2 and the superficial portions of the SiC substrate 1. The element isolation structures 3 define an active area on the compound semiconductor area 2.

Note that instead of the injection method described above, the element isolation may be performed by a shallow trench isolation (STI) method. In this case, for example, a chlorine-based etching gas may be used for dry etching of the compound semiconductor area 2.

Figure 1C:
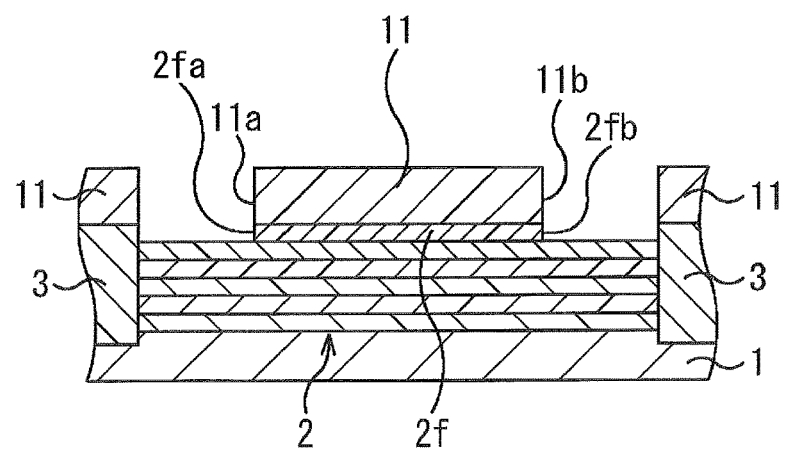

Subsequently, as illustrated in FIG. 1C, openings 2fa and 2fb are formed in the cap layer 2f.

Specifically, first, a resist is applied to the surface of the cap layer 2f.

The resist is processed by lithography to form, on the resist, openings that expand, by a predetermined distance with respect to positions where a source electrode 6 and a drain electrode 7 are to be formed. The predetermined distance may be, for example, greater than or equal to approximately 0.05 µm and less than or equal to approximately 0.5 µm. Here, the predetermined distance is approximately 0.1 µm. Thus, a resist mask 11 having two openings 11a and 11b is formed on the cap layer 2f.

Next, using the resist mask 11, portions of the cap layer 2f exposed from the openings 11a and 11b are dry-etched and removed to expose the surface of the electron supply layer 2e. As a result, the openings 2fa and 2fb are formed in the cap layer 2f. For the dry etching, an inert gas such as Ar and a chlorine-based gas such as $Cl_2$ are used as etching gases. The resist mask 11 is removed using a heated organic solvent.

Figure 2A:
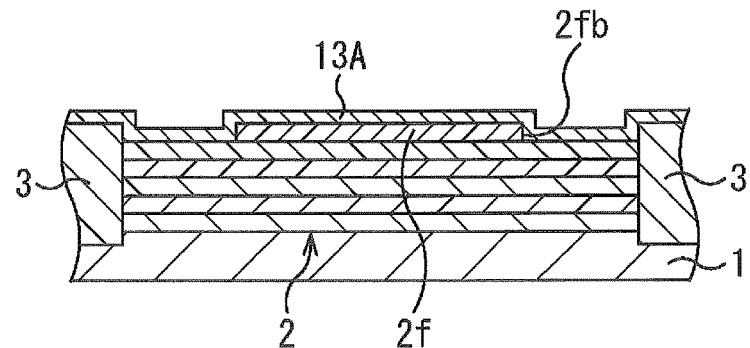
FIGS. 2A to 2C are schematic cross-sectional views sequentially illustrating steps subsequent to the steps in FIGS. 1A to 1C of the method for producing the InAlGaN HEMT according to the first embodiment.

Subsequently, as illustrated in FIG. 2A, an insulation film 13A is formed.

Specifically, first, for example, SiN is formed as the insulation film 13A on the entire surface of the compound semiconductor area 2 including inner wall surfaces of the openings 2fa and 2fb. Deposition of SiN may be performed, for example, by using a plasma CVD method. Also, $SiH_4$ and $NH_3$ gases are used as material gases such that the thickness is approximately 100 nm, for example. The insulation film 13A may be formed by $SiO_2$ or SiON instead of SiN.

Figure 2B:
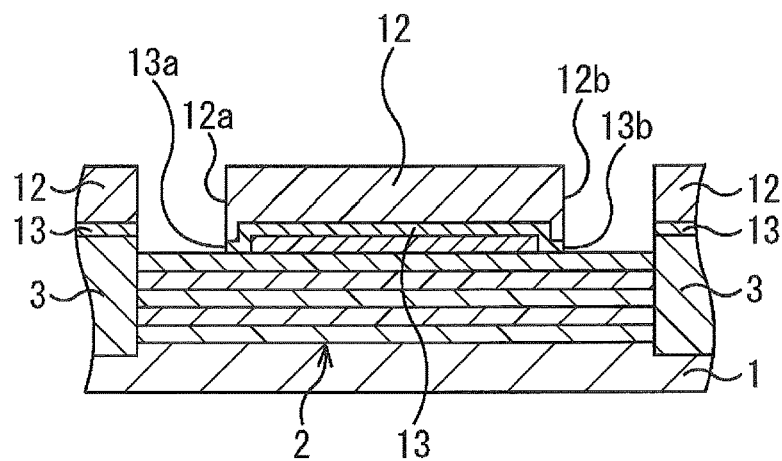

Next, as illustrated in FIG. 2B, a selective growth mask 13 is formed.

Specifically, first, a resist is applied to the surface of the insulation film 13A.

The resist is processed by lithography to form, on the resist, openings that expose positions where the source electrode 6 and the drain electrode 7 are to be formed. As a result, a resist mask 12 having two openings 12a and 12b is formed on the insulation film 13A.

Next, using the resist mask 12, dry etching is performed on the insulation film 13A to form openings that expose positions where the source electrode 6 and the drain electrode 7 are to be formed. For the dry etching, a $SF_6$ gas is used, for example. As a result, the selective growth mask 13 having openings 13a and 13b is formed. The openings 13a and 13b are formed in the selective growth mask 13 so as to expose areas (surface areas of the electron supply layer 2e) narrower than the openings 2fa and 2fb of the cap layer 2f. Parts of the selective growth mask 13 cover the surface of the electron supply layer 2e by approximately 0.1 μm from both ends of the cap layer 2f in the openings 2 fa and 2 fb.

Figure 2C:
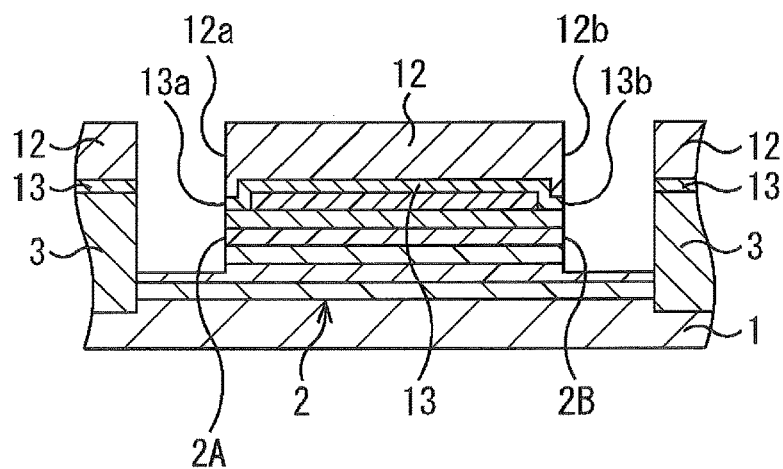

Subsequently, as illustrated in FIG. 2C, recesses 2A and 2B are formed on the compound semiconductor area 2.

More specifically, subsequently using the resist mask 12, dry etching is performed on parts of the compound semiconductor area 2 up to the depth of approximately 50 nm, for example. Here, dry etching is performed from the electron supply layer 2e, the intermediate layer 2d, the electron transit layer 2c up to parts of the buffer layer 2b. As a result, the recesses 2A and 2B are formed on the compound semiconductor area 2. For the dry etching, an inert gas such as Ar and a chlorine-based gas such as $Cl_2$ are used as etching gases. The resist mask 12 is removed using a heated organic solvent.

Figure 3A:
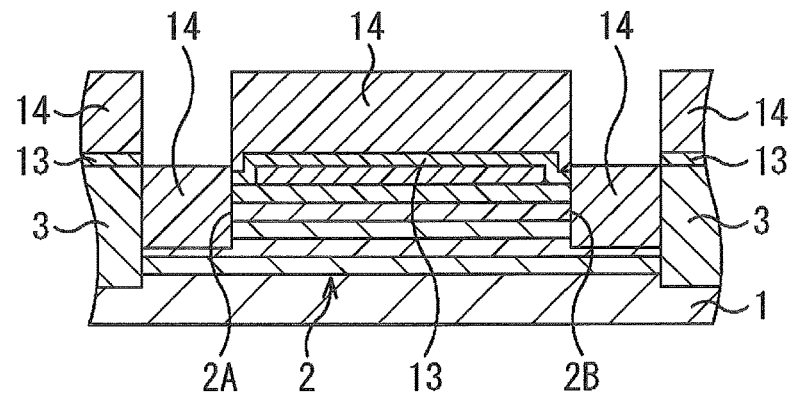
FIGS. 3A to 3C are schematic cross-sectional views sequentially illustrating steps subsequent to the steps in FIGS. 2A to 2C of the method for producing the InAlGaN HEMT according to the first embodiment.

Subsequently, as illustrated in FIG. 3A, $n^+$-GaN 14 is formed.

Specifically, for example, in a state in which the cap layer 2f is in contact with the selective growth mask 13, a Si atom beam containing Si as an n-type impurity is emitted by an MBE method or the like to grow (re-grow) the n+-GaN 14. The concentration of the n-type impurity (Si) of the n+-GaN 14 is higher than that of the cap layer 2f. The doping concentration of Si of the $n^+$-GaN 14 is, for example, approximately $2\times10^{19}/cm^3$. For example, the $n^+$-GaN 14 is formed to have a thickness of approximately 100 nm to fill the recesses 2A and 2B and the openings 13a and 13b that are respectively in communication.

The regrowth temperature of the n+-GaN 14 is set to be greater than or equal to approximately 700° C. and less than or equal to approximately 850° C. When the regrowth temperature is lower than approximately 700° C., sufficient selective regrowth of the n+-GaN 14 cannot be obtained. When the regrowth temperature is higher than 850° C., a crystal structure of the InAlGaN HEMT is possibly destroyed.

Figure 3B:
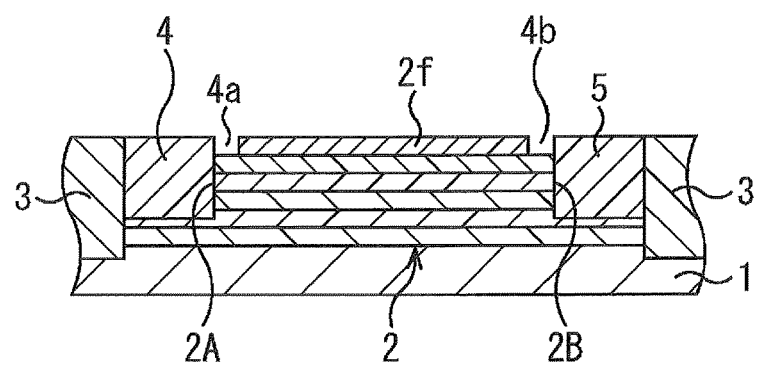

Subsequently, as illustrated in FIG. 3B, GaN plugs 4 and 5 are formed.

Specifically, the selective growth mask 13 and the portions of the n+-GaN 14 on the selective growth mask 13 are selectively removed by a wet process using an aqueous solution of hydrofluoric acid. As a result, the GaN plugs 4 and 5 embedded in the recesses 2A and 2B and protruding slightly upward from the recesses 2A and 2B are formed. The GaN plugs 4 and 5 are away from the respective end portions of the cap layer 2f, and gaps 4a and 4b are formed between the GaN plugs 4 and 5 and the respective end portion of the cap layer 2f.

Note that although the GaN plugs 4 and 5 are formed by the n+-GaN 14 in the embodiment described above, the GaN plugs 4 and 5 are not limited to this. For example, plugs may be formed by n+-InGaN instead of n+-GaN.

Figure 3C:
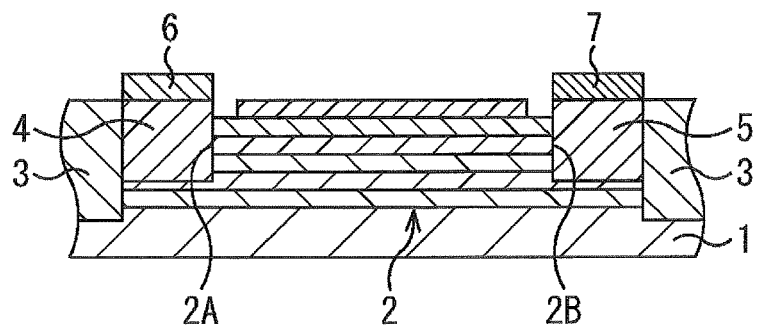

Next, as illustrated in FIG. 3C, the source electrode 6 and the drain electrode 7 that are ohmic electrodes are formed.

Specifically, first, a resist mask for forming the source electrode 6 and the drain electrode 7 is formed.

In this example, an eaves-structure two-layer resist suitable for a vapor deposition method and a lift-off method is used.

This resist is applied onto the compound semiconductor area 2, and openings that expose the upper surfaces of the GaN plugs 4 and 5 are formed. As a result, the resist mask having the openings is formed.

Using this resist mask, electrode materials such as Ti (lower layer) and Al (upper layer) are deposited by, for example, a high vacuum vapor deposition method on the resist mask having the openings that expose the upper surfaces of the GaN plugs 4 and 5. The thickness of Ti is approximately 20 nm, and the thickness of Al is approximately 200 nm. Next, the resist mask and Ti/Al deposited on the resist mask are removed by a lift-off method. Then, the SiC substrate 1 is heat-treated in, for example, a nitrogen atmosphere at a temperature approximately between 550° C. and 600° C. for alloying of remaining Ti/Al with the GaN Plugs 4 and 5. Thereby, an ohmic contact between Ti/Al and GaN of the GaN plugs 4 and 5 is established. Through the above process, the source electrode 6 aligned with the GaN plug 4 is formed on the GaN plug 4 and the drain electrode 7 aligned with the GaN plug 5 is formed on the GaN plug 5. The cap layer 2f is located between the source electrode 6 and the drain electrode 7. The end portion, closer to the drain electrode 7, of the source electrode 6 is away from the cap layer 2f in plan view, and the source electrode 6 is not in contact with the cap layer 2f. The end portion, closer to the source electrode 6, of the drain electrode 7 is away from the cap layer 2f in plan view, and the drain electrode 7 is not in contact with the cap layer 2f.

Between the GaN plugs 4 and 5 and the end portions of the cap layer 2f, the gaps 4a and 4b are formed. Due to the presence of the gap 4a, the source electrode 6 is away from the cap layer 2f by approximately the gap 4a in plan view, and is not in contact with the cap layer 2f. Due to the presence of the gap 4b, the drain electrode 7 is away from the cap layer 2f by approximately the gap 4b in plan view, and is not in contact with the cap layer 2f The widths of the gaps 4a and 4b are greater than or equal to approximately 0.05 μm and less than or equal to approximately 0.5 μm. In this case, the widths of the gaps 4a and 4b are 0.1 μm. When the widths of the gaps 4a and 4b are less than approximately 0.05 μm, ohmic contact resistance cannot be sufficiently reduced. When the widths of the gaps 4a and 4b are greater than approximately 0.5 μm, the protective effect on the compound semiconductor area 2 by the cap layer 2f is decreased.

The gap 4a on the source electrode 6 side and the gap 4b on the drain electrode 7 side may be formed such that the gap 4a is wide and the gap 4b is narrower than the gap 4a. A low ohmic contact resistance is particularly required on the source electrode 6 side rather than the drain electrode 7 side. Thus, it is preferable to increase the effect of reducing the ohmic contact resistance by forming a wide gap 4a so as to increase the effect of reducing the ohmic contact resistance and to increase the protective effect by the cap layer 2f on the compound semiconductor area 2 by forming the gap 4b narrower than the gap 4a.

Figure 4A:
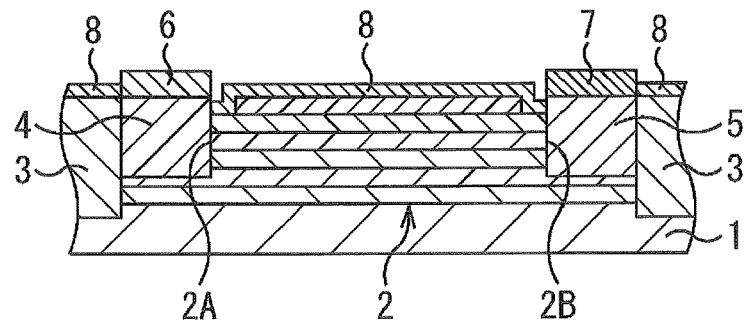
FIGS. 4A to 4C are schematic cross-sectional views sequentially illustrating steps subsequent to the steps in FIGS. 3A to 3C of the method for producing the InAlGaN HEMT according to the first embodiment.

Subsequently, as illustrated in FIG. 4A, a protective film 8 is formed.

Specifically, an insulator, for example, a SiN film is formed so as to cover the entire surface. Deposition of SiN may be performed, for example, by a plasma CVD method. Also, $SiH_4$ and $NH_3$ gases are used as material gases such that the thickness is approximately 50 nm, for example.

In this deposited SiN, the refractive index with respect to light with a wavelength of 633 nm is, for example, approximately 2.0 for stoichiometric SiN.

SiN is processed by lithography and dry etching to expose the upper surfaces of the source electrode 6 and the drain electrode 7. As a result, the protective film 8 is formed.

Figure 4B:
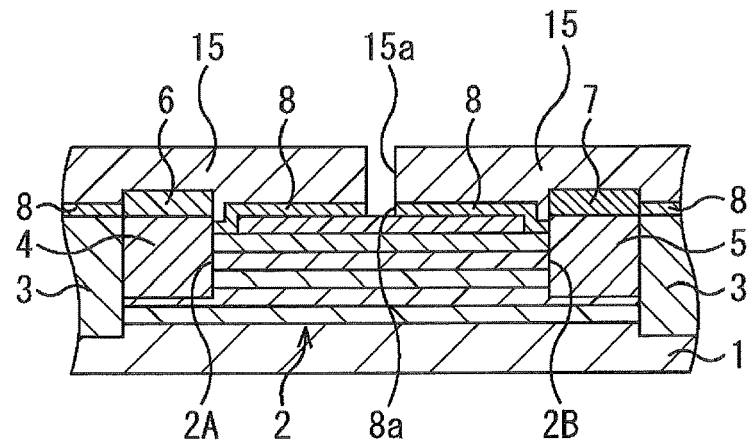

Subsequently, as illustrated in FIG. 4B, an opening 8a is formed in the protective film 8.

Specifically, first, a single-layer electron beam resist is applied onto the protective film 8. The electron beam resist is formed by a spin coating method and pre-baking, using, for example, PMMA (manufactured by MicroChem Corp., USA). The electron beam is caused to enter the resist to be exposed to light and developed so as to form, at the area where a gate electrode 9 is to be formed in the resist, an opening having a length of, for example, approximately 0.1 µm in the current direction. As a result, a resist mask 15 having an opening 15a is formed.

Next, using the resist mask 15, dry etching is performed on the protective film 8. Thus, the opening 8a is formed at an area where the gate electrode 9 is to be formed in the protective film 8. The resist mask 15 is removed by a wet process or the like using a chemical liquid.

Figure 4C:
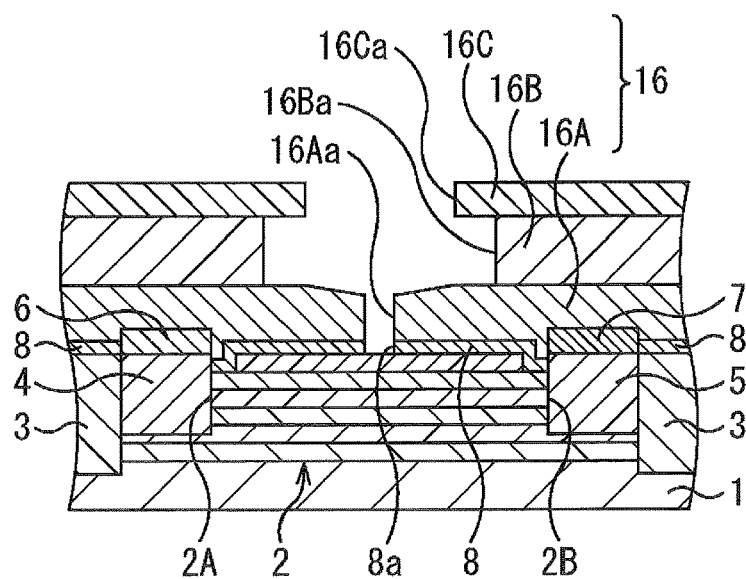

Subsequently, as illustrated in FIG. 4C, a three-layer electron beam resist 16 for forming the gate electrode 9 is formed.

The three-layer electron beam resist 16 is composed of, for example, PMMA (manufactured by MicroChem Corp., USA) as a lower layer resist 16A, PMGI (manufactured by MicroChem Coro., USA) as an intermediate layer resist 16B, and ZEP520 (manufactured by Zeon Corporation) as an upper layer resist 16C. The three-layer electron beam resist 16 is formed by, for example, a spin coating method and pre-baking. An electron beam is caused to enter the upper layer resist 16C to expose the upper layer resist 16C with light for a length of approximately 0.8 µm in the current direction. After electron beam lithography, an opening 16Ca having a length of 0.8 µm is formed in the upper layer resist 16C using, for example, liquid developer ZEP-SD (manufactured by Zeon Corporation).

Next, using, for example, NMD-W (manufactured by TOKYO OHKA KOGYO Co., Ltd.), an area set back by approximately 0.5 µm from the ends of the opening 16Ca of the upper layer resist 16C toward the source electrode 6 and the drain electrode 7 is removed to form an opening 16Ba in the intermediate layer resist 16B.

Next, an electron beam is caused to enter the lower layer resist 16A at the central portion of the opening 16Ba of the intermediate layer resist 16B so as to include the opening 8a of the protective film 8 for a length of approximately 0.1 µm or more in the current direction, thereby exposing the lower layer resist 16A to light. After electron beam lithography, an opening 16Aa having a length of 0.1 µm or more is formed in the lower layer resist 16A using, for example, liquid developer ZMD-B (manufactured by Zeon Corporation).

Figure 5A:
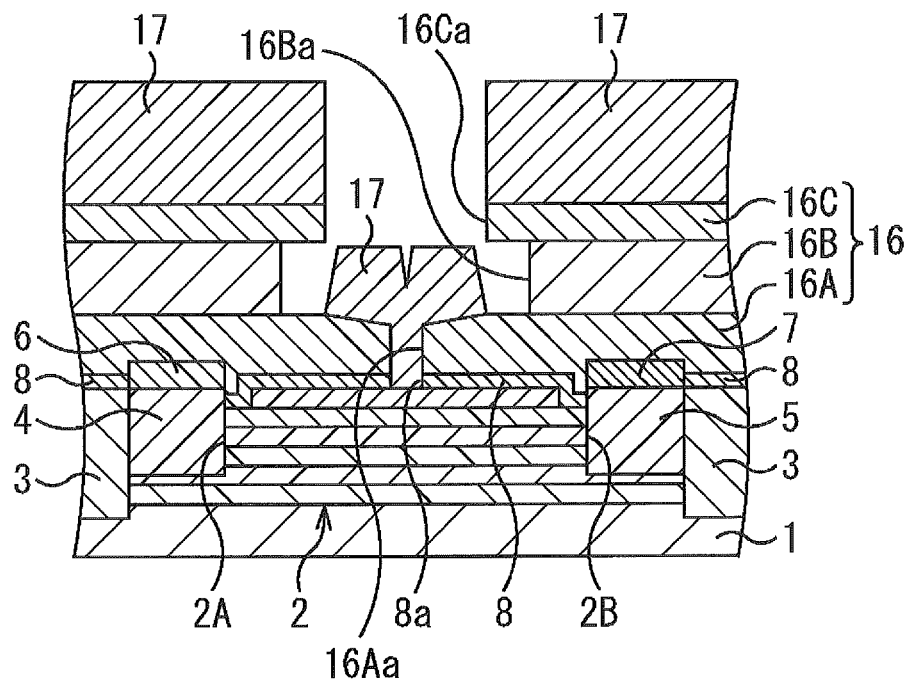
FIGS. 5A and 5B are schematic cross-sectional views sequentially illustrating steps subsequent to the steps in FIGS. 4A to 4C of the method for producing the InAlGaN HEMT according to the first embodiment.

Subsequently, as illustrated in FIG. 5A, electrode materials 17 are formed. For example, Ni/Au is deposited as the electrode materials 17 by, for example, a high vacuum vapor deposition method using the three-layer electron beam resist 16 as a mask. The thickness of Ni is approximately 10 nm and the thickness of Au is approximately 300 nm.

Figure 5B:
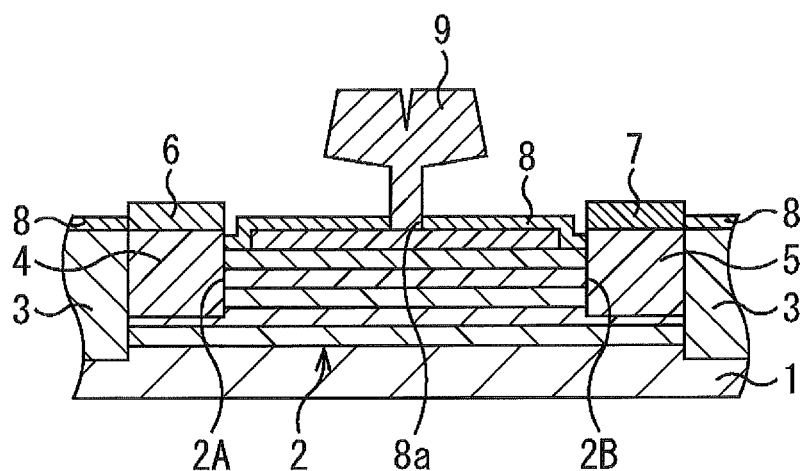

Subsequently, as illustrated in FIG. 5B, the gate electrode 9 is formed.

Using a heated organic solvent, the three-layer electron beam resist 16 and the electrode materials 17 deposited on the three-layer electron beam resist 16 are removed by a lift-off method. Through the above process, the gate electrode 9 is formed such that a part of the electrode materials 17 is embedded in the opening 8a of the protective film 8.

Thereafter, through steps of forming wires electrically connected to the source electrode 6, the drain electrode 7, and the gate electrode 9 and insulation films between layers as needed, an InAlGaN HEMT according to the first embodiment is formed.

In the following, effects of the InAlGaN HEMT according to the present embodiment will be described based on a comparison with a conventional InAlGaN HEMT.

In a conventional InAlGaN HEMT or an AlGaN HEMT including an electron supply layer with high Al composition, the ohmic contact resistance of the source electrode and the drain electrode, which are ohmic electrodes, is high. Therefore, a large current between the source electrode and the drain electrode due to a high two-dimensional electron density, which is a feature of such a material system, is not obtained. One cause of this high ohmic contact resistance is a high energy barrier (a barrier between a metal a semiconductor) due to high Al composition. In an ohmic electrode of a GaAs device or the like, an original schottky property disappears due to alloying/mixed crystals reaction, and the ohmic electrode forms an ohmic contact. Conversely, in a nitride semiconductor, it is considered that clear mixed crystals reaction does not progress easily, and the schottky property remains partly even after alloying between the ohmic electrode and the nitride semiconductor. Therefore, a high energy barrier formed at a metal-semiconductor interface as described above is a cause of increasing the ohmic contact resistance.

Figure 6:
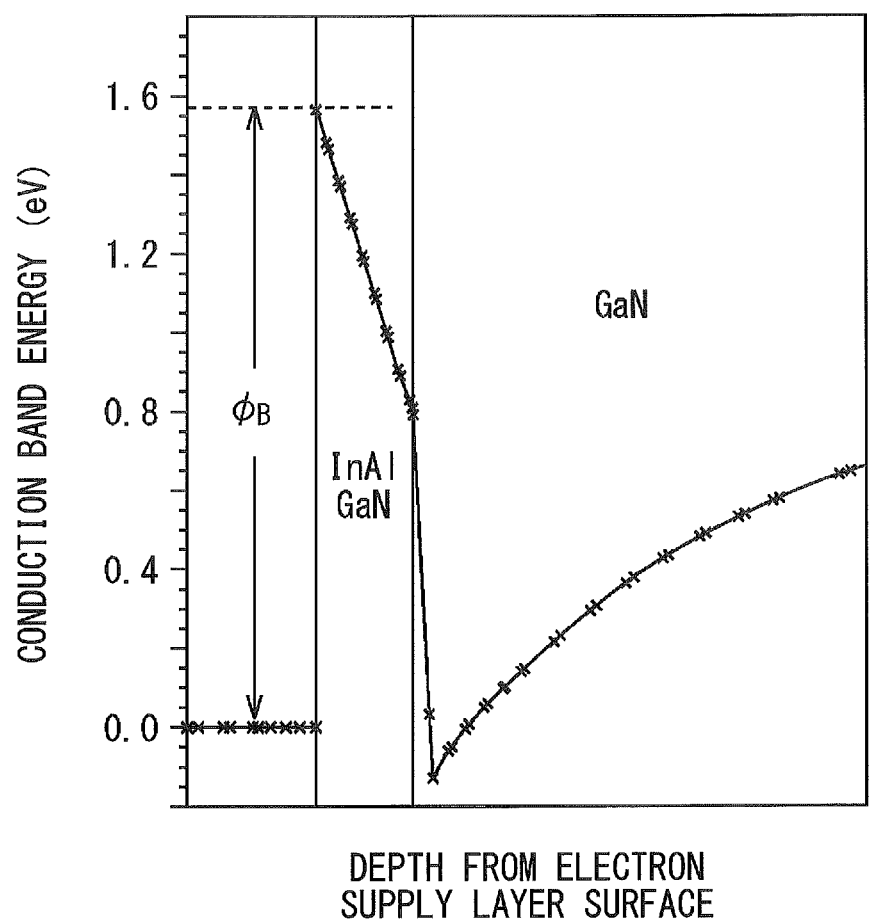
FIG. 6 is a characteristic diagram illustrating a band structure (a band structure before the structure is changed due to alloying) of a metal (Ni)-semiconductor interface for a source electrode and a drain electrode of a conventional InAlGaN HEMT (not having a cap layer)

FIG. 6 is a characteristic diagram illustrating a band structure (a band structure before the structure is changed due to alloying) of a metal (Ni)-semiconductor interface for a source electrode and a drain electrode of a conventional InAlGaN HEMT (not having a cap layer). Due to a large energy barrier, it is predicted that an electric current due to tunneling is limited and the ohmic contact resistance is high. This large ohmic contact resistance decreases the maximum current between the source electrode and the drain electrode and directly affects the output characteristics of an amplifier or the like. Furthermore, an electric field concentration due to the high contact resistance of the ohmic electrodes promotes physical and chemical changes, thereby decreasing the reliability of the ohmic electrodes.

As a method of reducing the above described ohmic contact, it is considered promising to selectively regrow a low energy barrier material such as n-GaN or n-InGaN (formation of a GaN plug) at a portion where an ohmic electrode is formed. However, in this case, it is inevitable for two-dimensional electron gas and the plug to be essentially point-connected, and this results in instability.

Figure 7A:
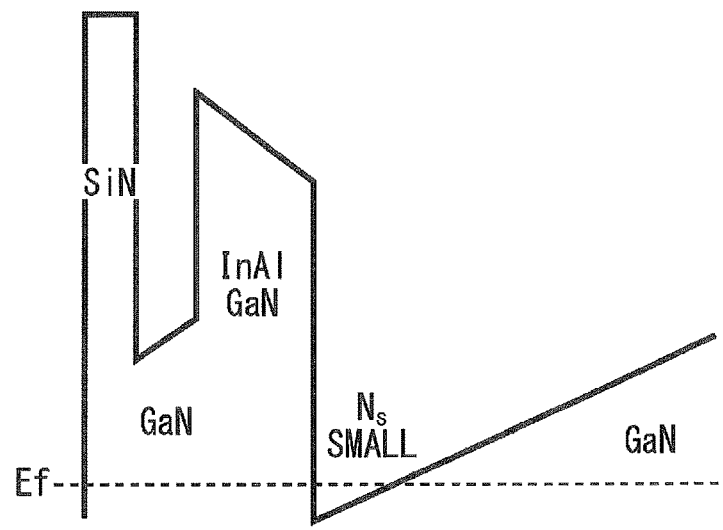
FIGS. 7A and 7B are band diagrams illustrating a difference in a conduction band structure depending on the presence/absence of a cap layer.
Figure 7B:
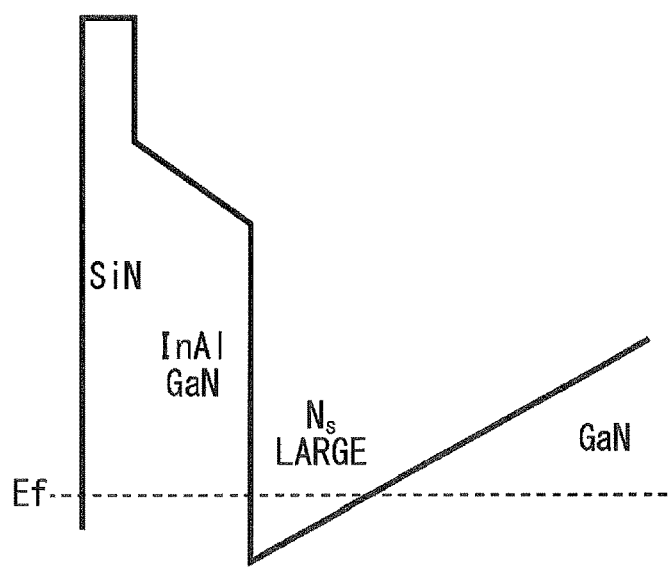

In a compound semiconductor device, in order to protect the surface of a compound semiconductor area, a cap layer such as n-GaN is provided at the uppermost portion. FIGS. 7A and 7B are band diagrams illustrating a difference in the conduction band structure depending on the presence/absence of a cap layer. FIG. 7A indicates a case of including a cap layer, and FIG. 7B indicates a case without a cap layer. It can be seen from FIGS. 7A and 7B that due to polarization charges in the cap layer, a conduction band rise occurs. This conduction band rise leads to a decrease in the concentration of two-dimensional electron gas and destabilization of point connection between the two-dimensional electron gas and a plug selectively regrown. Note that $N_s$ indicates the concentration of 2DEG in FIGS. 7A and 7B.

As illustrated in FIGS. 7A and 7B, the conduction band rises due to the cap layer, and the Fermi level in the triangular potential region decreases as compared with the case where a cap layer is not provided. Further, in crystal growth, an electron supply layer of an In-based nitride semiconductor is deposited at a particularly low temperature, and it is difficult to enhance the crystal quality of a cap layer that is deposited at a high temperature. Therefore, when an acceptor-type electron trap is formed, the concentration of two-dimensional electron gas is further decreased and destabilization of point connection between the two-dimensional electron gas and a plug is caused.

In this way, when a selective regrowth method is applied to a compound semiconductor area including a cap layer, due to a rise of the conduction band by the cap layer, the point connection between the two-dimensional electron gas and a plug causes instability. FIG. 8 is a table illustrating ohmic contact resistance for when a selective regrowth process is applied to a compound semiconductor area of an InAlGaN HEMT with respect to the presence/absence of a cap layer. In FIG. 8, the ohmic contact resistance of a HEMT chip obtained by applying the selective regrowth process to the compound semiconductor area including the cap layer is evaluated by using a TLM method (Transfer Length Method). FIG. 8 indicates the ohmic contact resistance at the orthogonal coordinate positions (x mm, y mm) when the coordinates of the substrate center are (0 mm, 0 mm). As a result of the evaluation, it is found that a HEMT chip for which the ohmic contact resistance cannot be reduced appears.

Figure 9A:
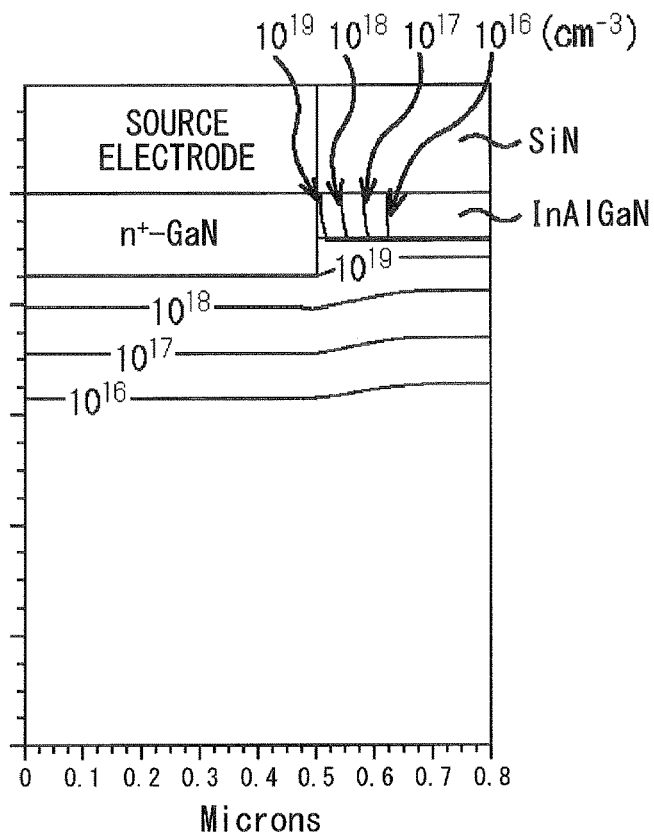
FIGS. 9A to 9C are characteristic diagrams illustrating calculation results, for the first embodiment and comparative examples, of electron concentration distributions in InAlGaN HEMTs to which a selective regrowth process is applied.
Figure 9B:
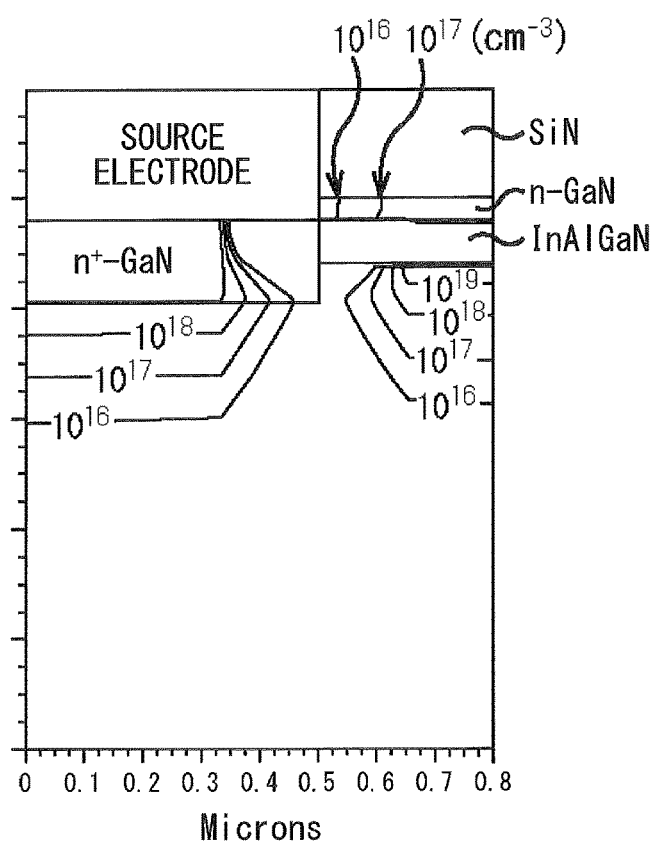
Figure 9C:
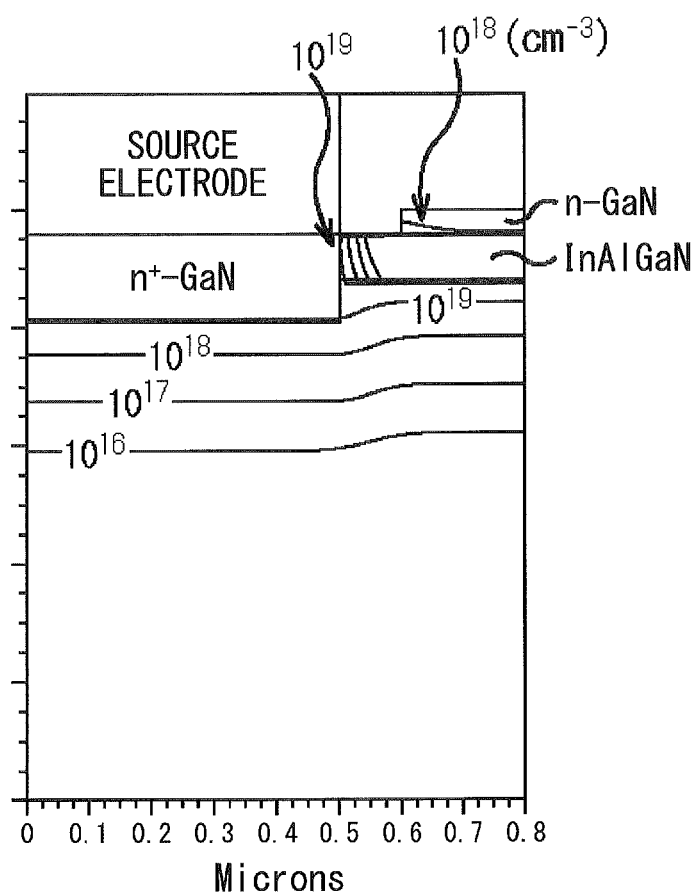

FIGS. 9A to 9C are characteristic diagrams illustrating calculation results, for the first embodiment and comparative examples, of carrier (electron) concentration distributions in InAlGaN HEMTs to which a selective regrowth process is applied. FIG. 9A indicates an electron concentration distribution of a Comparative Example 1 without a cap layer. FIG. 9B indicates an electron concentration distribution of a Comparative Example 2 having a cap layer in which an ohmic electrode is in contact with the cap layer. FIG. 9C indicates an electron concentration distribution of the first embodiment. The unit of the electron concentration is in $cm^{-3}$.

In FIG. 9A, an electrical connection is established between n+-GaN that is a selectively regrown plug directly below the source electrode and two-dimensional electron gas at the InAlGaN hetero interface. In FIG. 9B, an electrical connection between n+-GaN that is a selectively regrown plug directly below the source electrode and two-dimensional electron gas at the InAlGaN hetero interface is disconnected at the source electrode end. With respect to the above, according to the first embodiment, the end portion of the cap layer is located between the gate electrode and n+-GaN that is a selectively regrown plug directly below the source electrode, and the cap layer is not in contact with the source electrode and n+-GaN. Thereby, in FIG. 9C, an electrical connection is established between n+-GaN directly below the source electrode and two-dimensional electron gas at the InAlGaN hetero interface. Therefore, a reduction in ohmic contact resistance is realized.

Figure 10A:
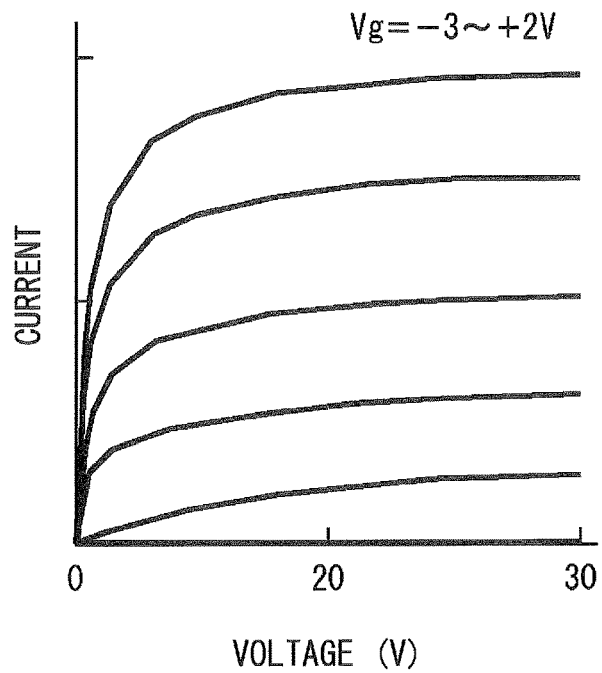
FIGS. 10A and 10B are characteristic diagrams illustrating three terminal characteristics in the InAlGaN HEMTs.
Figure 10B:
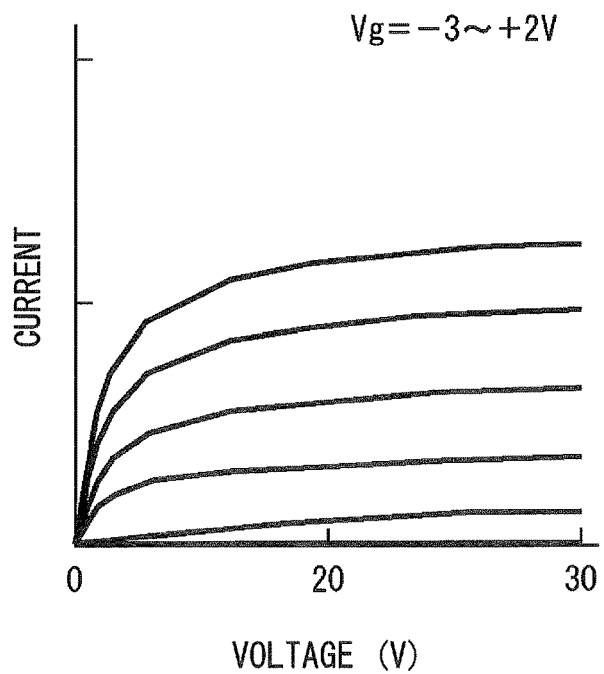

FIGS. 10A and 10B are characteristic diagrams illustrating three terminal characteristics in the InAlGaN HEMTs, wherein FIG. 10A indicates a characteristic diagram of the first embodiment and FIG. 10B indicates a characteristic diagram of a comparative example similar to FIG. 9B.

According to the first embodiment, it can be seen that a lower ON resistance and a larger maximum drain current can be obtained as compared with the comparative example.

As described above, according to the first embodiment, it is possible to realize an InAlGaN HEMT stably having low ohmic contact resistance for ohmic electrodes (the source electrode 6 and the drain electrode 7).

Second Embodiment

Similarly to the first embodiment, an InAlGaN HEMT that is a nitride semiconductor will be described as a compound semiconductor device according to a second embodiment. The second embodiment slightly differs from the first embodiment in compound semiconductor areas.

FIGS. 11 to 13 are schematic cross-sectional views sequentially illustrating steps of a method for producing an InAlGaN HEMT according to the second embodiment.

First, steps similar to those of FIG. 1A and FIG. 1B according to the first embodiment are performed. As a result, an element isolation structure 3 is formed in a compound semiconductor area 2 including a nucleation layer 2a, a buffer layer 2b, an electron transit layer 2c, an intermediate layer 2d, an electron supply layer 2e, and a cap layer 2f.

Figure 11A:
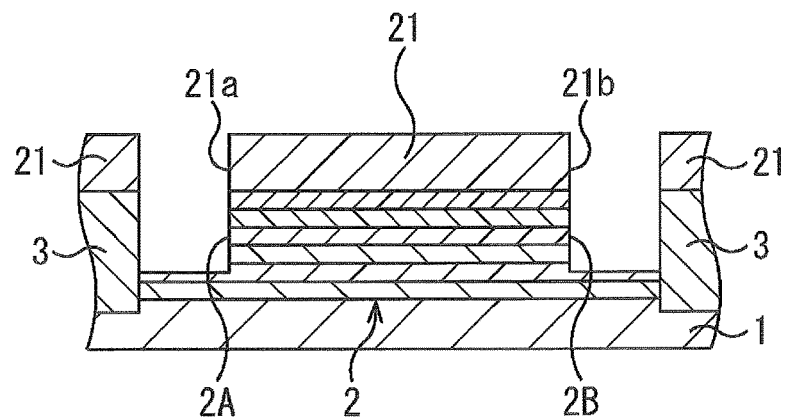
FIGS. 11A to 11C are schematic cross-sectional views illustrating main steps of a method for producing an InAlGaN HEMT according to a second embodiment.

Subsequently, as illustrated in FIG. 11A, recesses 2A and 2B are formed on the compound semiconductor area 2.

Specifically, a resist is applied to the surface of the compound semiconductor area 2. The resist is processed by lithography to form, on the resist, openings that expose positions where a source electrode 6 and a drain electrode 7 are to be formed. As a result, a resist mask 21 having two openings 21a and 21b are formed.

Subsequently, using the resist mask 21, dry etching is performed on parts of the compound semiconductor area 2 up to the depth of approximately 50 nm, for example. Here, dry etching is performed from the cap layer 2f, the electron supply layer 2e, the intermediate layer 2d, the electron transit layer 2c up to parts of the buffer layer 2b. As a result, the recesses 2A and 2B are formed on the compound semiconductor area 2. For the dry etching, an inert gas such as Ar and a chlorine-based gas such as $Cl_2$ are used as etching gases. The resist mask 21 is removed using a heated organic solvent.

Figure 11B:
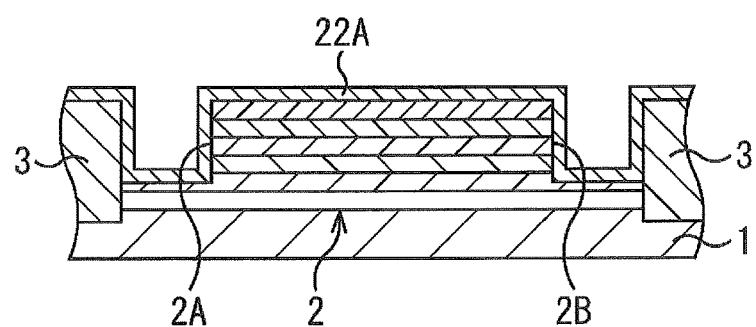

Subsequently, as illustrated in FIG. 11B, an insulation film 22A is formed.

Specifically, first, for example, SiN is formed as the insulation film 22A on the entire surface of the compound semiconductor area 2 including inner wall surfaces of the recesses 2A and 2B. Deposition of SiN may be performed, for example, by using a plasma CVD method. Also, $SiH_4$ and $NH_3$ gases are used as material gases such that the thickness is approximately 100 nm, for example. The insulation film 22A may be formed by $SiO_2$ or SiON instead of SiN.

Figure 11C:
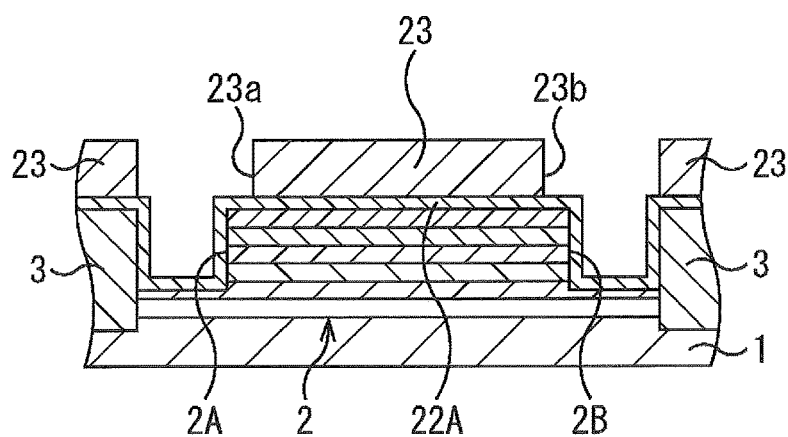

Subsequently, as illustrated in FIG. 11C, a resist mask 23 is formed.

Specifically, first, a resist is applied to the surface of the insulation film 22A. The resist is processed by lithography to form, on the resist, openings that expand, by a predetermined distance with respect to positions where a source electrode 6 and a drain electrode 7 are to be formed. The predetermined distance is, for example, greater than or equal to approximately 0.05 μm and less than or equal to approximately 0.05 μm. Here, the predetermined distance is approximately 0.1 µm. As a result, the resist mask 23 having two openings 23a and 23b is formed on the insulation film 22A.

Figure 12A:
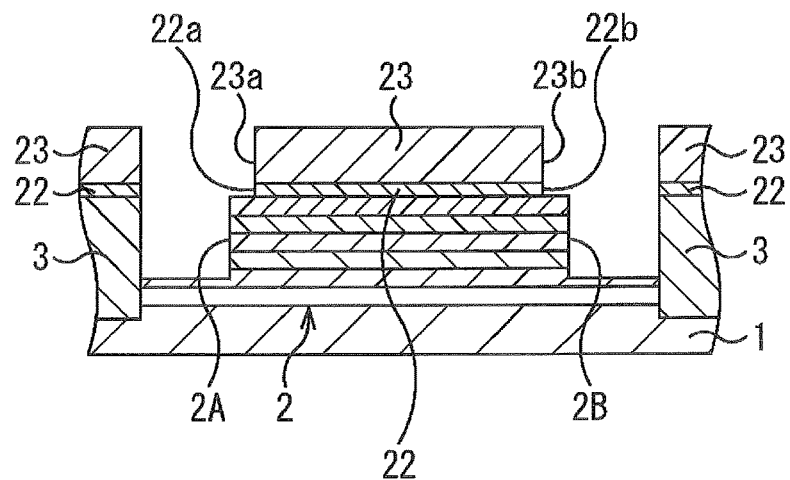
FIGS. 12A to 12C are schematic cross-sectional views illustrating main steps subsequent to the steps in FIGS. 11A to 11C of the method for producing the InAlGaN HEMT according to the second embodiment.

Next, as illustrated in FIG. 12A, a selective growth mask 22 is formed.

Specifically, using the resist mask 23, dry etching is performed on the insulation film 22A to form openings that expose the insulation film 22A at portions expanded by the predetermined distance with respect to the positions where the source electrode 6 and the drain electrode 7 are to be formed. For the dry etching, a $SF_6$ gas is used, for example. As a result, the selective growth mask 22 having openings 22a and 22b is formed. The openings 22a and 22b expose the recesses 2A and 2B and each end portion of the cap layer 2f with a width of approximately 0.1 µm.

Figure 12B:
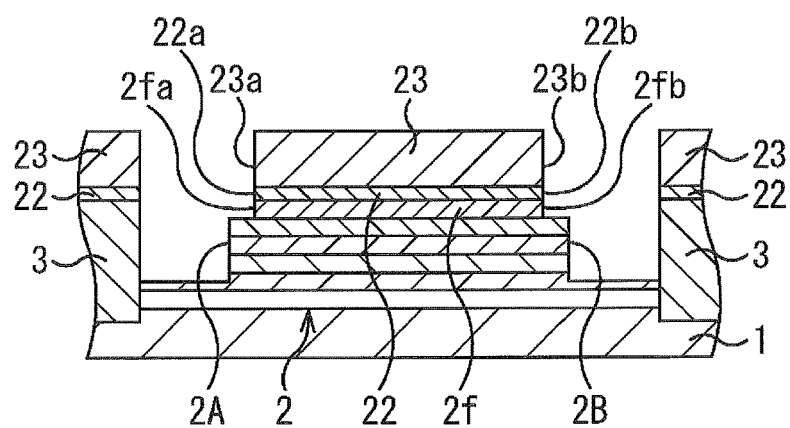

Subsequently, as illustrated in FIG. 12B, both end portions of the cap layer 2f are removed.

Specifically, subsequently using the resist mask 23, etching gases are switched to an inert gas such as Ar and a chlorine-based gas such as $Cl_2$, and portions of the cap layer 2f (both end portions having a width of approximately 0.1 µm) exposed from the openings 22a and 22b are dry-etched and removed to expose the surface of the electron supply layer 2e. As a result, openings 2fa and 2fb that are respectively in communication with the recesses 2A and 2B and that are wider by approximately 0.1 µm than the recesses 2A and 2B are formed in the cap layer 2f. The resist mask 23 is removed using a heated organic solvent.

Figure 12C:
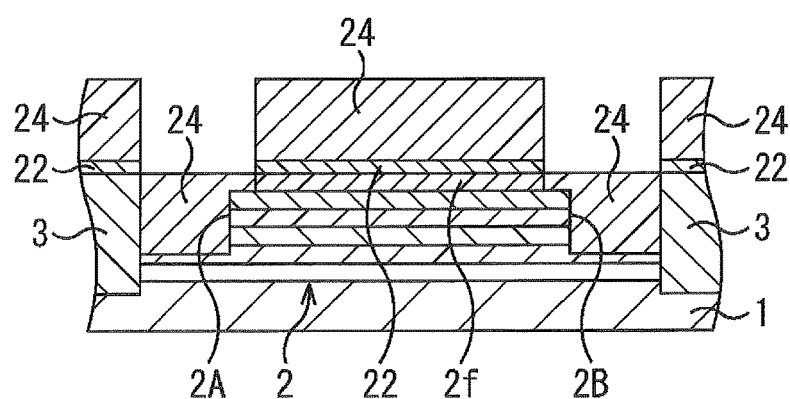

Subsequently, as illustrated in FIG. 12C, $n^+$-GaN 24 is formed.

Specifically, for example, in a state in which the cap layer 2f is in contact with the selective growth mask 22, a Si atom beam containing Si as an n-type impurity is emitted by an MBE method or the like to grow (re-grow) the n+-GaN 24. The concentration of the n-type impurity (Si) of the n+-GaN 24 is higher than that of the cap layer 2f. The doping concentration of Si of the $n^+$-GaN 24 is, for example, approximately $2\times10^{19}/cm^3$. For example, the $n^+$-GaN 24 is formed to have a thickness of approximately 100 nm to fill the recesses 2A and 2B and the openings 2fa and 2fb that are respectively in communication.

The regrowth temperature of the n+-GaN 24 is set to be greater than or equal to approximately 700° C. and less than or equal to approximately 850° C. When the regrowth temperature is lower than approximately 700° C., sufficient selective regrowth of the n+-GaN 24 cannot be obtained. When the regrowth temperature is higher than 850° C., a crystal structure of the InAlGaN HEMT is possibly destroyed.

Figure 13A:
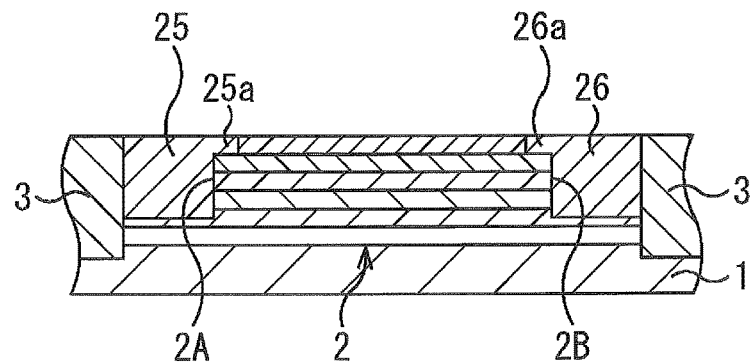
FIGS. 13A to 13C are schematic cross-sectional views illustrating main steps subsequent to the steps in FIGS. 12A to 12C of the method for producing the InAlGaN HEMT according to the second embodiment.

Subsequently, as illustrated in FIG. 13A, GaN plugs 25 and 26 are formed.

Specifically, the selective growth mask 22 and the portions of the $n^+$-GaN 24 on the selective growth mask 22 are selectively removed by a wet process using an aqueous solution of hydrofluoric acid. As described above, the GaN plugs 25 and 26 made of n+-GaN filling the recesses 2A and 2B and the openings 2fa and 2fb and contacting the end portions of the cap layer 2f are formed.

Note that although the GaN plugs 25 and 26 are formed by the n+-GaN 24 in the embodiment described above, the GaN plugs 25 and 26 are not limited to this. For example, plugs may be formed by n+-InGaN instead of n+-GaN.

Figure 13B:
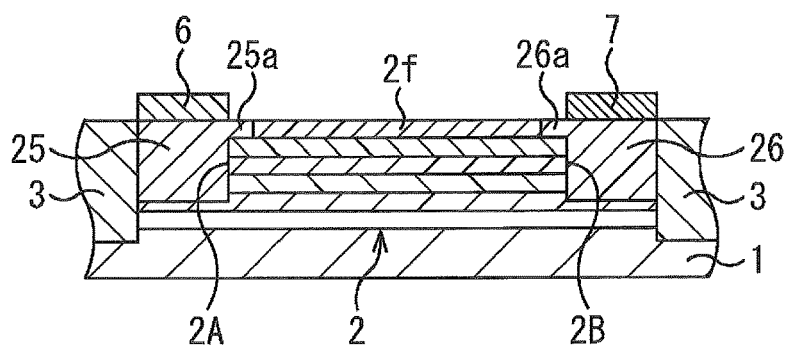

Next, as illustrated in FIG. 13B, the source electrode 6 and the drain electrode 7 that are ohmic electrodes are formed.

Specifically, first, a resist mask for forming the source electrode 6 and the drain electrode 7 is formed. In this example, an eaves-structure two-layer resist suitable for a vapor deposition method and a lift-off method is used. This resist is applied onto the compound semiconductor area 2, and openings that expose the upper surfaces of the GaN plugs 25 and 26 are formed. As a result, the resist mask having the openings is formed.

Using this resist mask, electrode materials such as Ti (lower layer) and Al (upper layer) are deposited by, for example, a high vacuum vapor deposition method on the resist mask having the openings that expose the upper surfaces of the GaN plugs 25 and 26. The thickness of Ti is approximately 20 nm, and the thickness of Al is approximately 200 nm. Next, the resist mask and Ti/Al deposited on the resist mask are removed by a lift-off method. Then, the SiC substrate 1 is heat-treated in, for example, a nitrogen atmosphere at a temperature approximately between 550° C. and 600° C. for alloying of remaining Ti/Al with the GaN Plugs 25 and 26. Thereby, an ohmic contact between Ti/Al and GaN of the GaN plugs 25 and 26 is established. Through the above process, the source electrode 6 is formed on the GaN plug 25 and the drain electrode 7 is formed on the GaN plug 26. A part of the GaN plug 25 protrudes from the end portion of the source electrode 6 toward the drain electrode 7. By this protruding portion 25a, the source electrode 6 is away from the cap layer 2f. A part of the GaN plug 26 protrudes from the end portion of the drain electrode 7 toward the source electrode 6. By this protruding portion 26a, the drain electrode 7 is away from the cap layer 2f.

An end portion of the cap layer 2f is located between the gate electrode 9 and the source electrode 6, and the cap layer 2f is not in contact with the source electrode 6. The gap between the source electrode 6 and the cap layer 2f is filled with a part of the integrally formed GaN plug 25. A part of the GaN plug 25 may extend to a part on the surface of the cap layer 2f. An end portion of the cap layer 2f is located between the gate electrode 9 and the drain electrode 7, and the cap layer 2f is not in contact with the drain electrode 7. The gap between the drain electrode 7 and the cap layer 2f is filled with a part of the integrally formed GaN plug 26. A part of the GaN plug 26 may extend to a part on the surface of the cap layer 2f. The predetermined gaps (the widths of the gaps) are greater than or equal to approximately 0.05 µm and less than or equal to approximately 0.5 µm. In this case, the widths of the gaps are 0.1 µm. When the widths of the gaps are less than approximately 0.05 µm, ohmic contact resistance cannot be sufficiently reduced. When the widths of the gaps are greater than approximately 0.5 µm, the protective effect on the compound semiconductor area 2 by the cap layer 2f is decreased.

Here, the gap between the source electrode 6 and the cap layer 2f may be made wide such that the gap between the drain electrode 7 and the cap layer 2f is narrower than the gap between the source electrode 6 and the cap layer 2f. A low ohmic contact resistance is particularly required on the source electrode 6 side rather than the drain electrode 7 side. Thus, it is preferable to increase the effect of reducing the ohmic contact resistance by forming a wide gap between the source electrode 6 and the cap layer 2f. In addition, it is preferable to increase the protective effect by the cap layer 2f on the compound semiconductor area 2 by forming a narrow gap between the drain electrode 7 and the cap layer 2f.

Figure 13C:
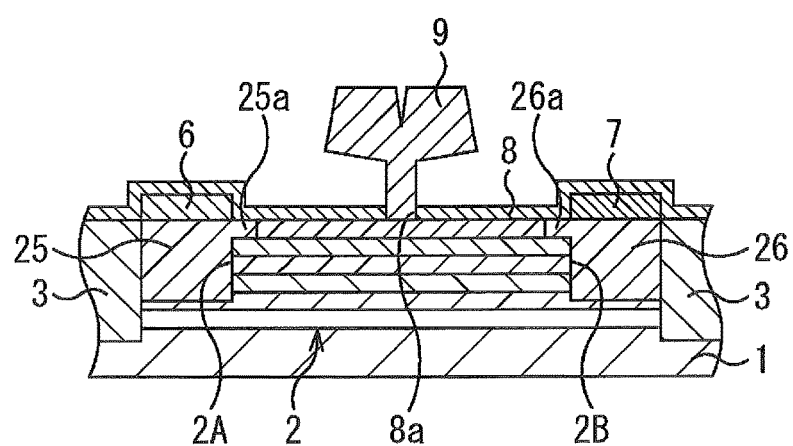

Subsequently, by performing steps similar to those of FIG. 4A to FIG. 5B according to the first embodiment, as illustrated in FIG. 13C, a gate electrode 9 is formed.

Thereafter, through steps of forming wires electrically connected to the source electrode 6, the drain electrode 7, and the gate electrode 9 and insulation films between layers as needed, an InAlGaN HEMT according to the second embodiment is formed.

Figure 14A:
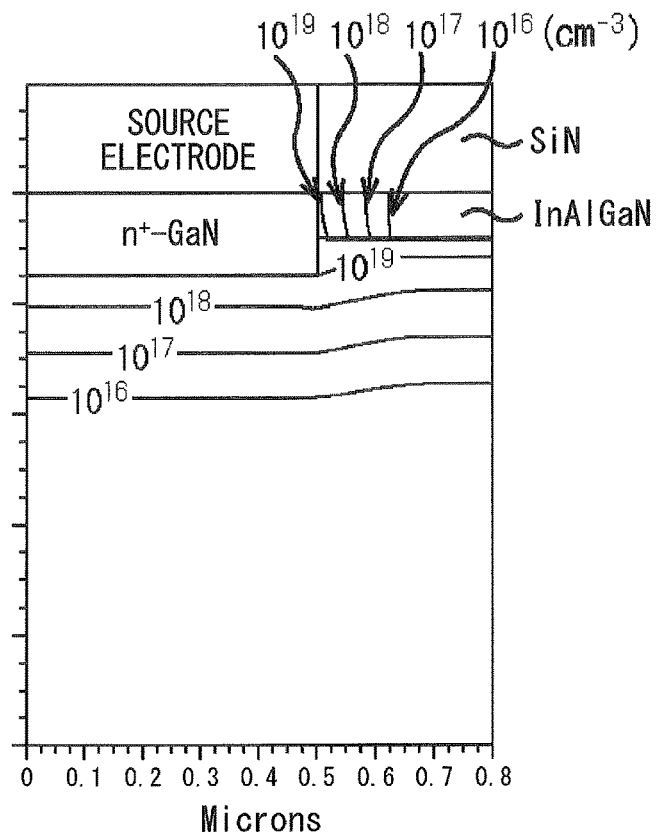
FIGS. 14A to 14C are characteristic diagrams illustrating calculation results, for the second embodiment and comparative examples, of electron concentration distributions in InAlGaN HEMTs to which a selective regrowth process is applied.
Figure 14B:
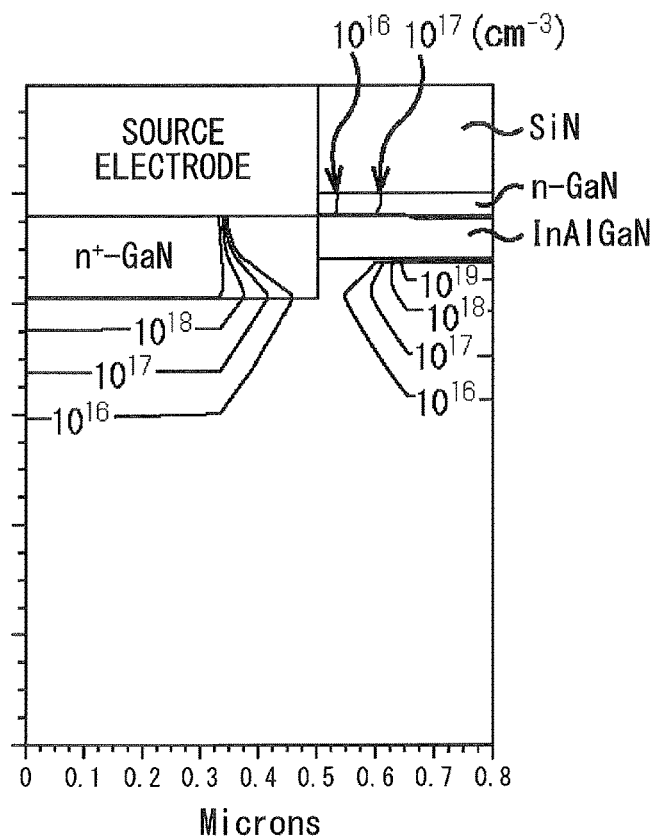
Figure 14C:
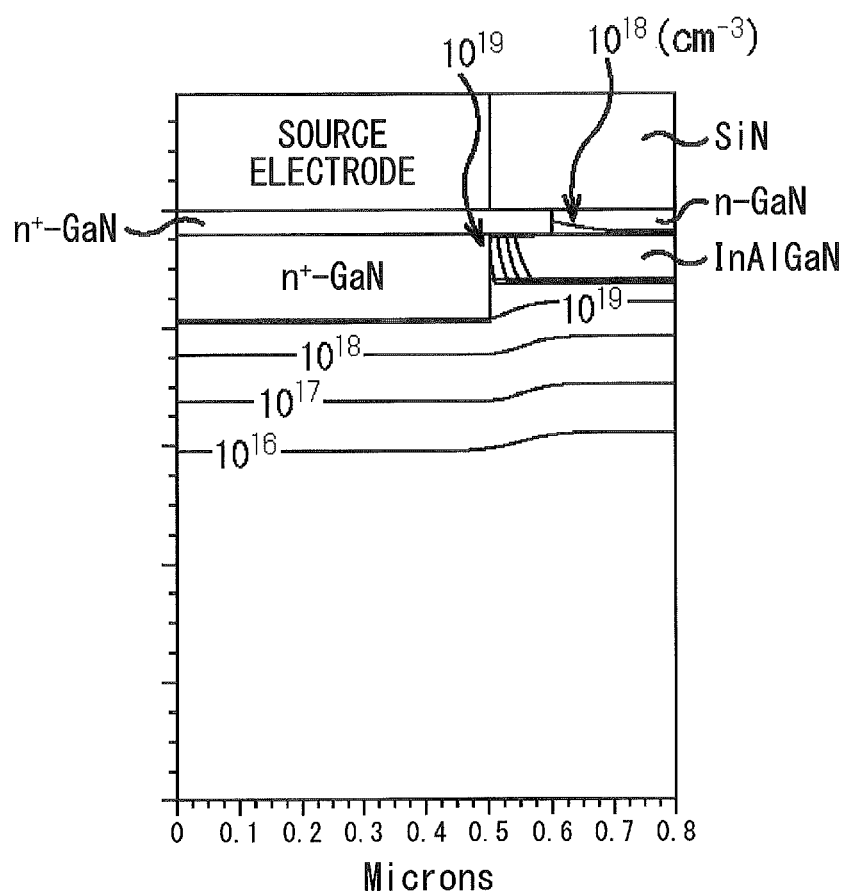

FIGS. 14A to 14C are characteristic diagrams illustrating calculation results, for the second embodiment and comparative examples, of electron concentration distributions in InAlGaN HEMTs to which a selective regrowth process is applied. FIG. 14A indicates an electron concentration distribution of a Comparative Example 1 without a cap layer. FIG. 14B indicates an electron concentration distribution of a Comparative Example 2 having a cap layer in which an ohmic electrode is in contact with the cap layer. FIG. 14C indicates an electron concentration distribution of the second embodiment. The unit of the electron concentration is in $cm^{-3}$.

In FIG. 14A, an electrical connection is established between n+-GaN that is a selectively regrown plug directly below the source electrode and two-dimensional electron gas at the InAlGaN hetero interface. In FIG. 14B, an electrical connection between n+-GaN that is a selectively regrown plug directly below the source electrode and two-dimensional electron gas at the InAlGaN hetero interface is disconnected at the source electrode end. With respect to the above, according to the second embodiment, the cap layer 2f is away from the source electrode n+-GaN that is a selectively regrown plug directly below the source electrode, and the cap layer 2f is not in contact with the source electrode and n+-GaN. Thereby, in FIG. 14C, an electrical connection is established between a portion of n+-GaN aligned with the source electrode and directly below the source electrode (portion other than the portion filling the opening of the cap layer) and two-dimensional electron gas at the InAlGaN hetero interface. Therefore, a reduction in ohmic contact resistance is realized.

Figure 15A:
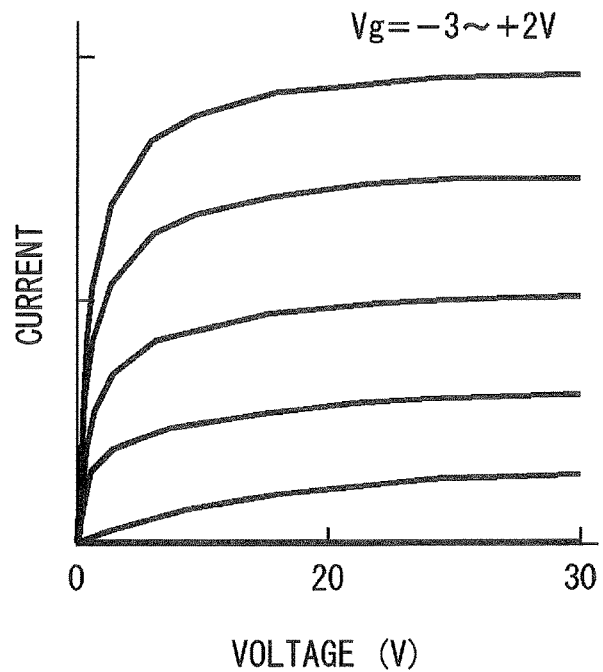
FIGS. 15A and 15B are characteristic diagrams illustrating three terminal characteristics in the InAlGaN HEMTs.
Figure 15B:
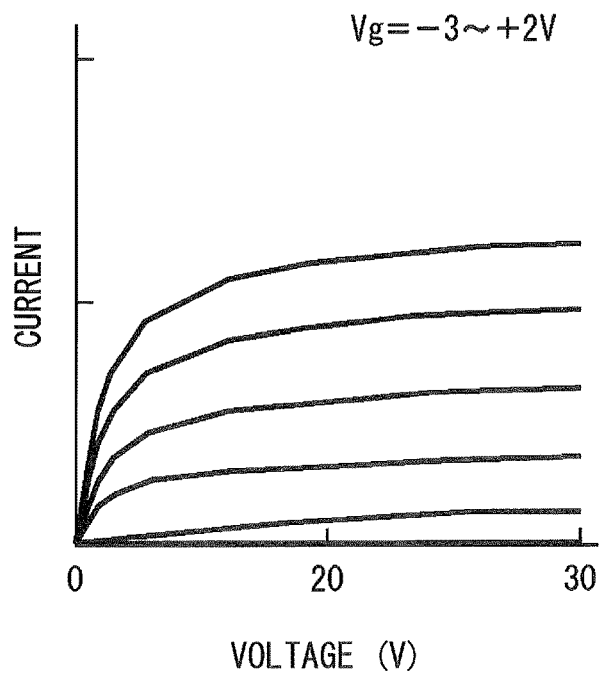

FIGS. 15A and 15B are characteristic diagrams illustrating three terminal characteristics in the InAlGaN HEMTs, wherein FIG. 15A indicates a characteristic diagram of the second embodiment and FIG. 15B indicates a characteristic diagram of a comparative example similar to FIG. 9B.

According to the second embodiment, it can be seen that a lower ON resistance and a larger maximum drain current can be obtained as compared with the comparative example.

As described above, according to the second embodiment, it is possible to realize an InAlGaN HEMT stably having low ohmic contact resistance for ohmic electrodes (the source electrode 6 and the drain electrode 7).

Note that although the gate electrode 9 is formed in a T shape in the cross section in the gate length direction in the first and second embodiments, the gate electrode 9 is not limited to this. For example, a gate electrode whose cross-sectional shape is rectangular in the gate length direction may be formed.

Also, although the Schottky type InAlGaN HEMTs are described as examples in the first and second embodiments, the invention is not limited to these. For example, an MIS-type InAlGaN HEMT having a gate insulation film between an cap layer 2f and a gate electrode 9 may be produced. For example, a protective film 8 having an appropriate thickness may be used as the gate insulation film without forming an opening in the protective film 8. As the gate insulation film, oxide, nitride, or oxynitride of Si, Al, Hf, Zr, Ti, Ta or W is preferably selected or two or more of these are preferably selected to be deposited in multi layers.

Third Embodiment

A power-supply device according to a third embodiment to which one InAlGaN HEMT according to the first or second embodiment will be described.

Figure 16:
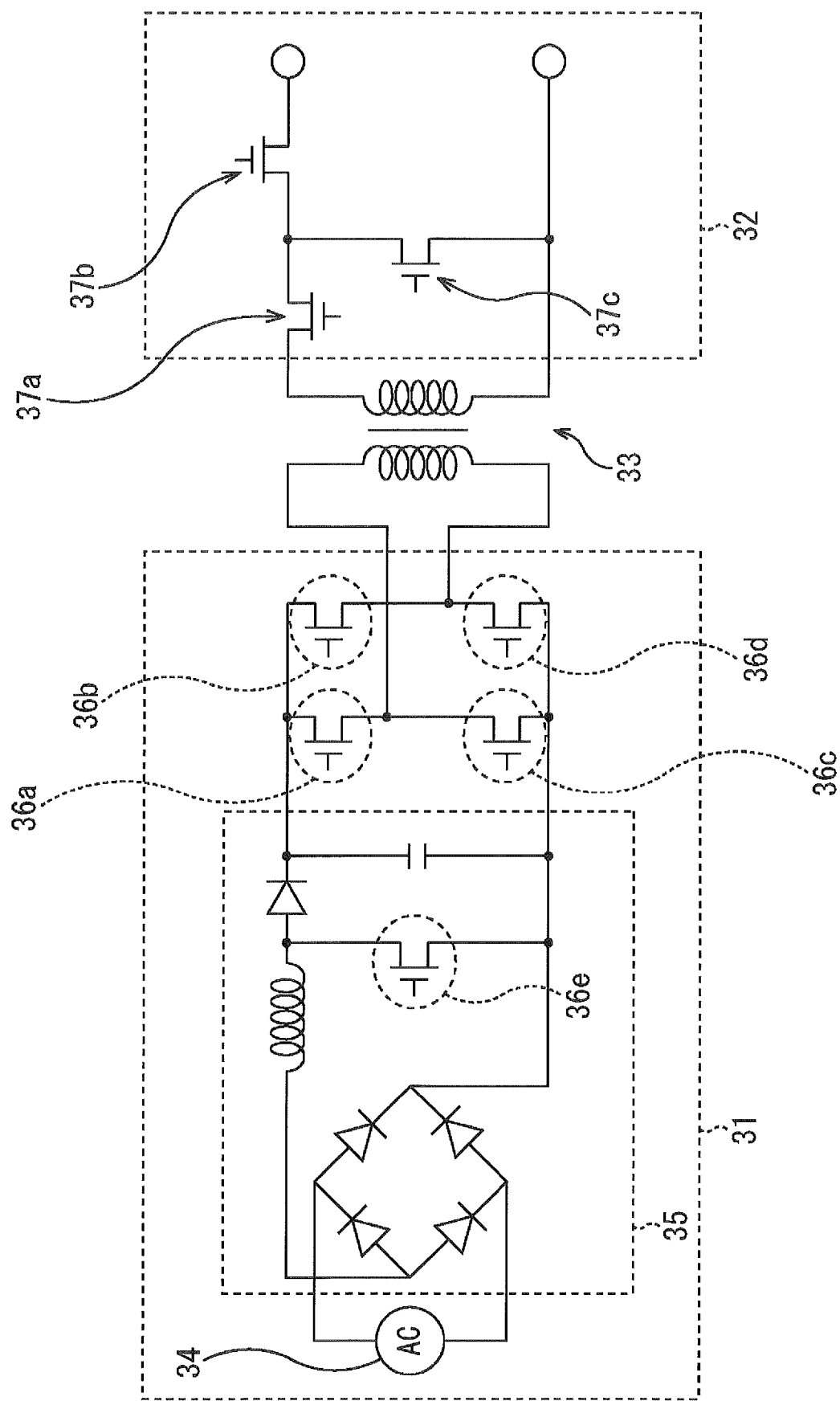
FIG. 16 is a wiring diagram illustrating a schematic configuration of a power-supply device according to a third embodiment.

FIG. 16 is a wiring diagram illustrating a schematic configuration of the power-supply device according to the third embodiment.

The power-supply device according to the third embodiment includes a high-voltage primary circuit 31, a low-voltage secondary circuit 32, and a transformer 33 disposed between the primary circuit 31 and the secondary circuit 32.

The primary circuit 31 includes an alternating-current power supply 34, a bridge rectifier circuit 35, and multiple (four in the third embodiment) switching elements 36a, 36b, 36c, and 36d. Also, the bridge rectifier circuit 35 includes a switching element 36e.

The secondary circuit 32 includes multiple (three in the third embodiment) switching elements 37a, 37b, and 37c.

In the third embodiment, the switching elements 36a, 36b, 36c, 36d, and 36e of the primary circuit 51 are implemented by an InAlGaN HEMT according to the first or second embodiment. The switching elements 37a, 37b, and 37c of the secondary circuit 32 are implemented by normal MISFETs using silicon.

To the power-supply device according to the third embodiment, an InAlGaN HEMT stably having low ohmic contact resistance for ohmic electrodes (the source electrode 6 and the drain electrode 7) is applied. As a result, the high power power-supply device is highly reliable.

Fourth Embodiment

A high-frequency amplifier according to a fourth embodiment to which an InAlGaN HEMT according to the first or second embodiment will be described.

Figure 17:
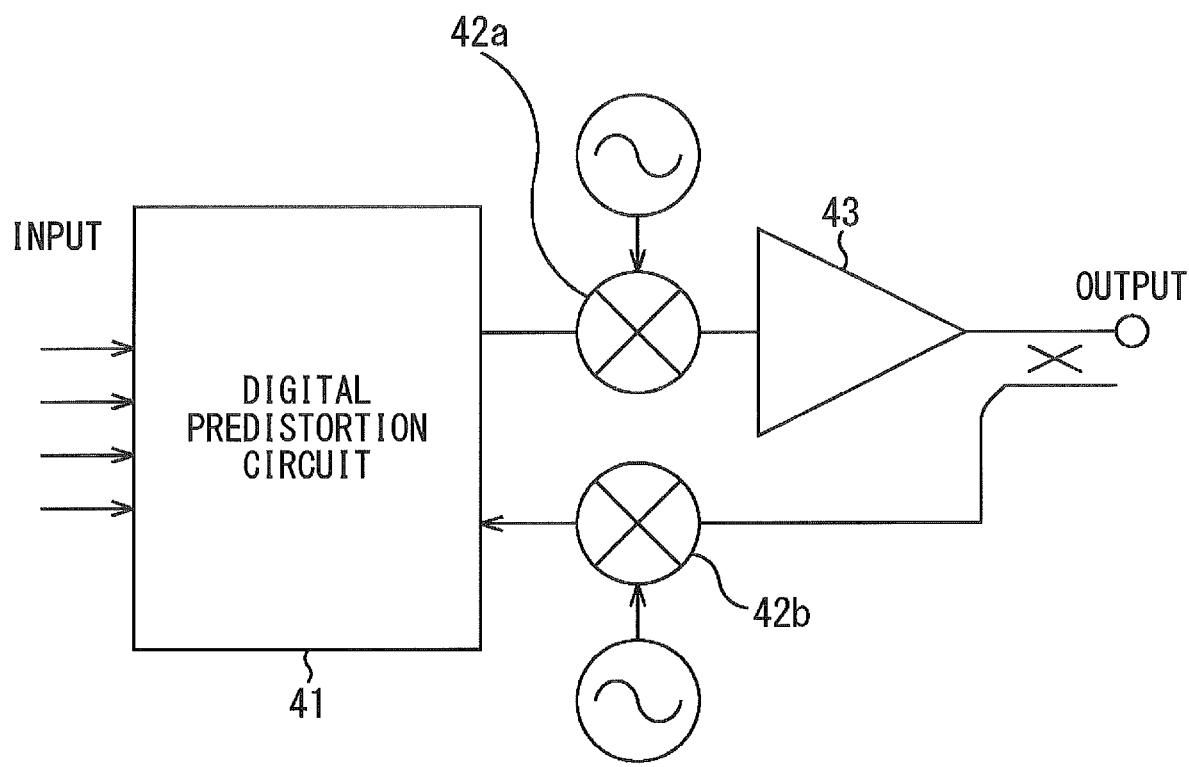
FIG. 17 is a wiring diagram illustrating a schematic configuration of a high-frequency amplifier according to a fourth embodiment.

FIG. 17 is a wiring diagram illustrating a schematic configuration of the high-frequency amplifier according to the fourth embodiment.

The high-frequency amplifier according to the fourth embodiment includes a digital predistortion circuit 41, mixers 42a and 42b, and a power amplifier 43.

The digital predistortion circuit 41 compensates for non-linear distortion with respect to an input signal. The mixer 42a mixes the input signal of which the non-linear distortion was compensated with an AC signal. The power amplifier 43 amplifies the input signal mixed with the AC signal and includes an InAlGaN HEMT according to the first or second embodiment. Note that the high-frequency amplifier illustrated in FIG. 17 can, in accordance with a switching operation, for example, mix an output-side signal with an AC signal using the mixer 42b, and can send the mixed signal to the digital predistortion circuit 41.

To the high-frequency amplifier according to the fourth embodiment, an InAlGaN HEMT stably having low ohmic contact resistance for ohmic electrodes (the source electrode 6 and the drain electrode 7) is applied. Thereby, the high-frequency amplifier is highly reliable and has a high pressure resistance.

According to an aspect of the embodiments, a compound semiconductor device may include:

a compound semiconductor area including, at an upper most portion, a protective layer made of a compound semiconductor; and an ohmic electrode provided on the compound semiconductor area, the ohmic electrode being away from the protective layer in plan view and being not in contact with the protective layer.

According to an aspect of the embodiments, in the above semiconductor device, wherein the ohmic electrode may be a source electrode and a drain electrode, and wherein a width of a gap between the source electrode and the protective layer may be wider than a width of a gap between the drain electrode and the protective layer.

According to an aspect of the embodiments, in the above semiconductor device, the protective layer may contain GaN or InGaN.

According to an aspect of the embodiments, in the above semiconductor device, the protective layer may have a Ga/N ratio less than 1.

According to an aspect of the embodiments, a method for producing a compound semiconductor device may include:

forming a compound semiconductor area including, at an upper most portion, a protective layer made of a compound semiconductor;

forming, on the compound semiconductor area, an ohmic electrode that is away from the protective layer in plan view and that is not in contact with the protective layer; and forming and embedding a compound semiconductor plug in a portion of the compound semiconductor area where ohmic electrode is to be formed, wherein the compound semiconductor plug may be provided directly below the ohmic electrode.

According to an aspect of the embodiments, in the above method for producing the compound semiconductor device, in a state in which an insulation film that is in contact with the protective layer is formed, the compound semiconductor plug may be formed at a temperature greater than or equal to 700° C. and less than or equal to 850° C.

According to an aspect of the embodiments, in the above method for producing the compound semiconductor device, the protective layer may have a Ga/N ratio less than 1.

According to an aspect of the embodiments, in the above method for producing the compound semiconductor device, wherein the ohmic electrode may be a source electrode and a drain electrode, and wherein a width of a gap between the source electrode and the protective layer may be wider than a width of a gap between the drain electrode and the protective layer.

According to an aspect of the embodiments, in the above method for producing the compound semiconductor device, the protective layer may contain GaN or InGaN.

According to an aspect of the embodiments, a power-supply device may include:

a high-voltage circuit that includes a transistor;
a low-voltage circuit; and
a transformer disposed between the high-voltage circuit and the low-voltage circuit,
    wherein the transistor may include
    a compound semiconductor area including, at an upper most portion, a protective layer made of a compound semiconductor; and
    an ohmic electrode provided on the compound semiconductor area, the ohmic electrode being away from the protective layer in plan view and being not in contact with the protective layer.

According to an aspect of the embodiments, a high-frequency amplifier for amplifying an input high-frequency voltage to output the amplified voltage may include:

a transistor,
    wherein the transistor may include
    a compound semiconductor area including, at an upper most portion, a protective layer made of a compound semiconductor; and
    an ohmic electrode provided on the compound semiconductor area, the ohmic electrode being away from the protective layer in plan view and being not in contact with the protective layer.

All examples and conditional language provided herein are intended for pedagogical purposes of aiding the reader in understanding the invention and the concepts contributed by the inventors to further the art, and are not to be construed as limitation to such specifically recited examples and conditions, nor does the organization of such examples in the specification relate to a showing of superiority and inferiority of the invention. Although one or more embodiments of the present invention have been described in detail, it should be understood that various changes, substitutions, and alterations could be made hereto without departing from the spirit and scope of the invention.

What is claimed is:

1. A compound semiconductor device comprising:
    a compound semiconductor area including, at an upper most portion, a protective layer made of a compound semiconductor; and
    an ohmic electrode provided on the compound semiconductor area, the ohmic electrode not overlapping the protective layer in plan view and being not in contact with the protective layer,
    wherein the compound semiconductor area includes a compound semiconductor plug provided directly below the ohmic electrode,
    wherein a concentration of an n-type impurity contained in the compound semiconductor plug is higher than a concentration of an n-type impurity contained in the protective layer, and
    wherein a compound semiconductor portion is provided in at least a gap between the protective layer and the ohmic electrode.

2. The compound semiconductor device according to claim 1,
    wherein the ohmic electrode is a pair of electrodes, and
    wherein the protective layer is located between the pair of electrodes.

3. The compound semiconductor device according to claim 1, wherein the compound semiconductor portion contains an n-type impurity whose concentration is higher than the concentration of the n-type impurity of the protective layer.

4. The compound semiconductor device according to claim 1, wherein the compound semiconductor portion is integrally formed with the compound semiconductor plug.

5. The compound semiconductor device according to claim 1, wherein a gap between the protective layer and the ohmic electrode is greater than or equal to 0.05 µm and less than or equal to 0.5 µm.

6. The compound semiconductor device according to claim 1, wherein the compound semiconductor area includes an electron supply layer that is an uppermost portion between the protective layer and the ohmic electrode.

7. The compound semiconductor device according to claim 6, wherein the electron supply layer contains one type of compound selected from InAlGaN, InAlN, AlGaN, and AlN.

* * * * *